(12) United States Patent
Lu et al.

(10) Patent No.: US 11,625,158 B2
(45) Date of Patent: Apr. 11, 2023

(54) METHOD FOR DISPLAYING SIMULATION IMAGES THROUGH CLICKING AND ROLLING OPERATIONS

(71) Applicant: CaseNode Technology Service CO., LTD., Kaohsiung (TW)

(72) Inventors: Shih-Chieh Lu, Kaohsiung (TW); Shu-Fen Lin, Kaohsiung (TW)

(73) Assignee: CaseNode Technology Service CO., LTD., Kaohsiung (TW)

(*) Notice: Subject to any disclaimer, the term of this patent is extended or adjusted under 35 U.S.C. 154(b) by 0 days.

(21) Appl. No.: 17/685,394

(22) Filed: Mar. 3, 2022

(65) Prior Publication Data
US 2022/0291817 A1 Sep. 15, 2022

(30) Foreign Application Priority Data
Mar. 15, 2021 (TW) .................. 110109230

(51) Int. Cl.
*G06F 3/04845* (2022.01)

(52) U.S. Cl.
CPC ................ *G06F 3/04845* (2013.01)

(58) Field of Classification Search
CPC .................................. G06F 3/04845
USPC ........................................ 715/764
See application file for complete search history.

(56) References Cited

U.S. PATENT DOCUMENTS

| | | | |
|---|---|---|---|
| 5,355,447 A | 10/1994 | Knowlton | |
| 6,083,267 A | 7/2000 | Motomiya | |
| 6,122,391 A | 9/2000 | Ringland | |
| 7,522,970 B2 | 4/2009 | Fernandez | |
| 7,657,340 B2 | 2/2010 | Lind | |
| 7,930,056 B2 | 4/2011 | Fernandez | |
| 8,116,895 B2 | 2/2012 | Fernandez | |
| 8,174,539 B1* | 5/2012 | Samaniego | G06T 11/001 345/581 |
| 8,185,231 B2 | 5/2012 | Fernandez | |
| 8,545,335 B2 | 10/2013 | Fiegener | |
| 8,930,012 B2 | 1/2015 | Fernandez | |
| 9,858,361 B2 | 1/2018 | Fernandez | |
| 10,300,362 B2 | 5/2019 | Reilly | |
| 10,486,050 B2 | 11/2019 | Reilly | |
| 10,821,347 B2 | 11/2020 | Reilly | |
| 11,030,806 B2 | 6/2021 | Bretschneider | |

(Continued)

FOREIGN PATENT DOCUMENTS

| | | |
|---|---|---|
| CN | 111461820 A | 7/2020 |
| TW | 200703049 | 1/2007 |

(Continued)

*Primary Examiner* — Reza Nabi
*Assistant Examiner* — Hwei-Min Lu
(74) *Attorney, Agent, or Firm* — Winston Hsu

(57) ABSTRACT

A method for displaying simulation images through clicking and rolling operations is provided. A client device executes an application program to display a carrying object on a display unit. Then, the application program generates a click event at the carrying object according to the client device and produces the corresponding event result by displaying at least one structural object on the carrying object. When the click event ends, at least one template object is loaded. The client device then rolls and thereby removes the carrying object such that the at least one structural object is superimposed on the template object to complete a superimposed display.

8 Claims, 13 Drawing Sheets

(56) References Cited

U.S. PATENT DOCUMENTS

| | | | | |
|---|---|---|---|---|
| 2006/0041847 A1* | 2/2006 | Maw | ............... | G06F 3/0483 |
| | | | | 715/793 |
| 2007/0146389 A1* | 6/2007 | Distler | ............... | G06T 15/04 |
| | | | | 345/629 |
| 2008/0082605 A1* | 4/2008 | Minatogawa | ...... | H04N 1/00145 |
| | | | | 709/203 |
| 2008/0163344 A1 | 7/2008 | Yang | | |
| 2012/0197755 A1* | 8/2012 | Felder | ............ | G06Q 30/0643 |
| | | | | 705/26.8 |
| 2014/0282159 A1* | 9/2014 | Lee | ............... | G06F 3/0481 |
| | | | | 715/768 |
| 2017/0322695 A1* | 11/2017 | Simpson | ............ | G06F 3/0486 |
| 2018/0064217 A1* | 3/2018 | Ambrose | ............ | A44C 17/0225 |
| 2018/0331701 A1 | 11/2018 | Chang | | |
| 2019/0108292 A1* | 4/2019 | Bowen | ............... | G06N 5/046 |

FOREIGN PATENT DOCUMENTS

| | | |
|---|---|---|
| TW | I366799 | 6/2012 |
| TW | 201601066 A | 1/2016 |
| TW | 202040348 A | 11/2020 |
| WO | WO-2016075263 A1 * 5/2016 ............. G06T 11/00 |

\* cited by examiner

METHOD FOR DISPLAYING SIMULATION IMAGES THROUGH CLICKING AND ROLLING OPERATIONS

BACKGROUND OF THE INVENTION

1. Field of the Invention

The present invention relates to a method for displaying simulation images through clicking and rolling operations. More particularly, the invention relates to a design simulation method that displays the images of two objects in a superimposed manner.

2. Description of the Prior Art

People have a great demand for design in products such as decorative items and personal accessories. These demands are often directed to the latest style and fashion. Consumers' variable preferences also accelerate the change of trends.

Products are constantly improved in design to attract consumers' attention. To shorten the time from manufacture to sale, it is common practice to maintain the specifications and structure of a product and change only the external design in order to give the product a new look, the objective being to appeal to consumers' visual perception, to provide consumers with more designs to choose from, and to thereby gain a marketing edge. Generally, the visual effect of the external or decorative design of a decorative item, personal accessory, or other similar product is assessed by making a sample of the product and placing/using the sample as designed, and only by doing so can the overall decorative effect be evaluated in order to determine if the design complies with its requirements or needs any adjustment. Currently, there is no way to simulate the visual effect of the overall appearance and layout of a product immediately after a decorative design is made for the product.

In terms of product design methods, therefore, a solution to shortening the time required for design, for evaluating/simulating a design result, and for making product samples is called for. Moreover, it is not uncommon that one who wishes to buy a physical decorative object is presented with completed standard design diagrams for selection. If the consumer wishes to make their own design, it is necessary for the consumer to provide a self-made diagram to a manufacturer, and for the manufacturer to actually make the consumer-designed decorative object so that the consumer can wear or use the decorative object in order to determine if the decorative object conforms to their imagination in design. It is impossible for the consumer to simulate the effect of wearing or using the decorative object together with other objects—let alone determine if the decorative object meets the design and use requirements or needs to be modified or adjusted—immediately upon completing the design.

To solve the aforesaid problems, the present invention provides a method for displaying simulation images through clicking and rolling operations. The method uses a digital rendering technique to display a carrying object on a client device so that a user of the client device can experience a simplified design process through the click event generated by an application program. The method also allows a rolling operation to be performed to enable a simulated presentation of the design result on various template objects, thereby adding a sense of presence to the digital experience. The method can be used extensively to provide and display simulation images associated with the design process, and of the design results, of physical products and virtual products alike.

SUMMARY OF THE INVENTION

The primary objective of the present invention is to provide a method for displaying simulation images through clicking and rolling operations. According to the method, a client device executes an application program to display a carrying object and then generate a click event in order to display a structural object on the carrying object. The client device then rolls the carrying object until the carrying object disappears, leaving the structural object on a template object. Thus, a user can experience the design process of placing different structural objects on different templates. The method can be applied not only to the decorative design of such physical products as personal accessories, daily objects, and electronic products, but also to the design of virtual products and virtual items in electronic games.

The secondary objective of the present invention is to provide a method for displaying simulation images through clicking and rolling operations whereby a client device gives a simulated presentation according to the result of a click event to add a sense of presence to, and thereby enhance, the resulting digital experience.

To achieve the foregoing objectives, the present invention discloses a method for displaying simulation images through clicking and rolling operations, and the method is carried out as follows. To begin with, a client device executes an application program in order to display a carrying object on a display unit. Then, the application program generates a click event at the carrying object according to the client device so as to produce an event result. More specifically, the click event provides at least one set of click position coordinates that correspond to displaying at least one structural object on the carrying object, and the event result is the at least one structural object being displayed as superimposed on the carrying object. Next, it is determined if the click event has ended, and if yes, at least one template object is loaded in order to display the event result on the display unit as superimposed on a selected one of the at least one template object. After that, the client device rolls the carrying object until the carrying object disappears from the display unit. As a result, the at least one structural object is displayed on the display unit as superimposed on a synthesis area of the selected template object. The method disclosed herein for displaying simulation images through clicking and rolling operations helps a user to design the exterior of a product and can simulate the overall visual effect of the design result immediately. Thus, the invention enables better customization services or design modes than currently achievable.

In one embodiment of the present invention, the method disclosed herein further includes the client device generating a simulated presentation event in which a dynamic or static image corresponding to the at least one structural object and the selected template object is displayed on the display unit.

In one embodiment of the present invention, the step of the application program generating a click event at the carrying object according to the client device includes the application program displaying at least one structural object and the carrying object on the display unit according to at least one network record of the client device.

In one embodiment of the present invention, the step of the client device rolling the carrying object until the carrying object disappears from the display unit includes the application program detecting an image position on the display unit that corresponds to a rotation axis parameter of the carrying object and of a virtual rotation axis connected to the carrying object, and displaying a dynamic image of the carrying object according to time value data corresponding to the virtual rotation axis being moved by the client device. The dynamic image of the carrying object corresponds to the time value data, and the application program renders, and displays on the display unit, the degree of rolling of the carrying object according to the time value data.

In one embodiment of the present invention, the at least one structural object has a carrying object correlation parameter set as "being separated from the carrying object" and is displayed on the synthesis area of the selected template object. Any other structural object has a carrying object correlation parameter set as "being connected to the carrying object" and is rolled along with the carrying object according to the time value data until disappearing from the display unit.

In one embodiment of the present invention, the carrying object includes a first-layer object and a second-layer object. The carrying object correlation parameter of the at least one structural object is "being separated from the first-layer object and the second-layer object of the carrying object" such that the image of the at least one structural object is displayed on the synthesis area of the selected template object. The carrying object correlation parameter of any other structural object is "being connected to the second-layer object of the carrying object" such that a shielding object makes not only the second-layer object of the carrying object but also the any other structural object connected to the second-layer object of the carrying object disappear from the display unit. The first-layer object of the carrying object, on the other hand, is rolled according to the time value data until disappearing.

In one embodiment of the present invention, the step of the client device executing the application program in order to display the carrying object on the display unit includes the application program reading a carrying object database through a server processing unit of a server in order to render the carrying object and display the carrying object on the display unit.

In one embodiment of the present invention, the step of the application program generating a click event at the carrying object according to the client device includes the application program reading an object database through a server processing unit of a server and displaying or hiding at least one structural object corresponding to the at least one set of click position coordinates on the display unit.

In one embodiment of the present invention, the step of the application program generating a click event at the carrying object according to the client device includes the application program displaying with animation, or hiding, at least one structural object according to the at least one set of click position coordinates, or using a shielding object to switch at least one structural object to being displayed or hidden on the display unit. Any structural object that is displayed on the display unit is separated from the carrying object, and any structural object that is hidden on the display unit is connected to the carrying object.

These and other objectives of the present invention will no doubt become obvious to those of ordinary skill in the art after reading the following detailed description of the preferred embodiment that is illustrated in the various figures and drawings.

DETAILED DESCRIPTION

The aforesaid and other objectives as well as the features and advantages of the present invention can be better understood by referring to the following detailed description of some preferred embodiments of the invention in conjunction with the accompanying drawings.

Figure 1:
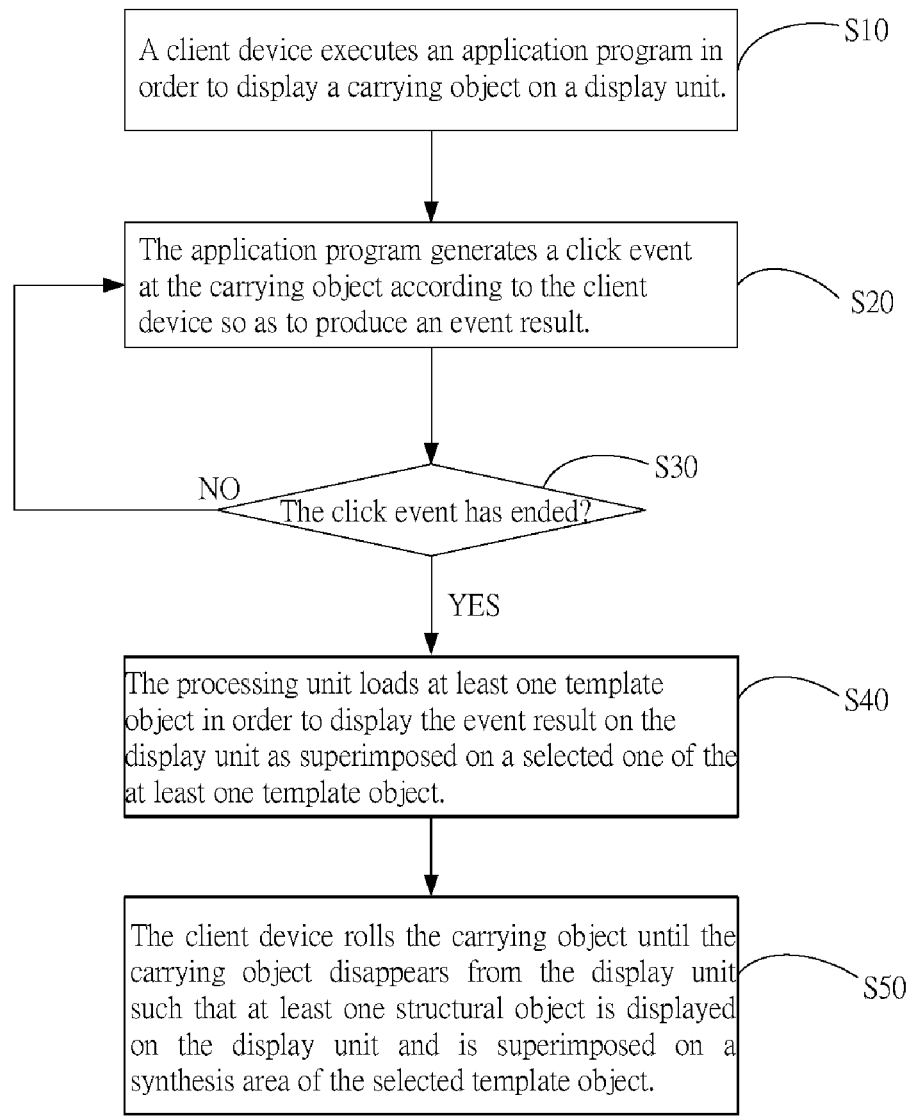
FIG. 1 is the flowchart of the first embodiment of the present invention.

Please refer to FIG. 1 for the flowchart of the first embodiment of the present invention. As shown in FIG. 1, the method of the invention for displaying simulation images through clicking and rolling operations includes the following steps:

Step S10: A client device executes an application program in order to display a carrying object on a display unit.

Step S20: The application program generates a click event at the carrying object according to the client device so as to produce an event result.

Step S30: It is determined if the click event has ended.

Step S40: At least one template object is loaded in order to display the event result and a selected one of the at least one template object on the display unit in a superimposed manner.

Step S50: The client device rolls the carrying object until the carrying object disappears from the display unit, leaving at least one structural object displayed on the display unit and superimposed on a synthesis area of the selected template object.

Figure 2:
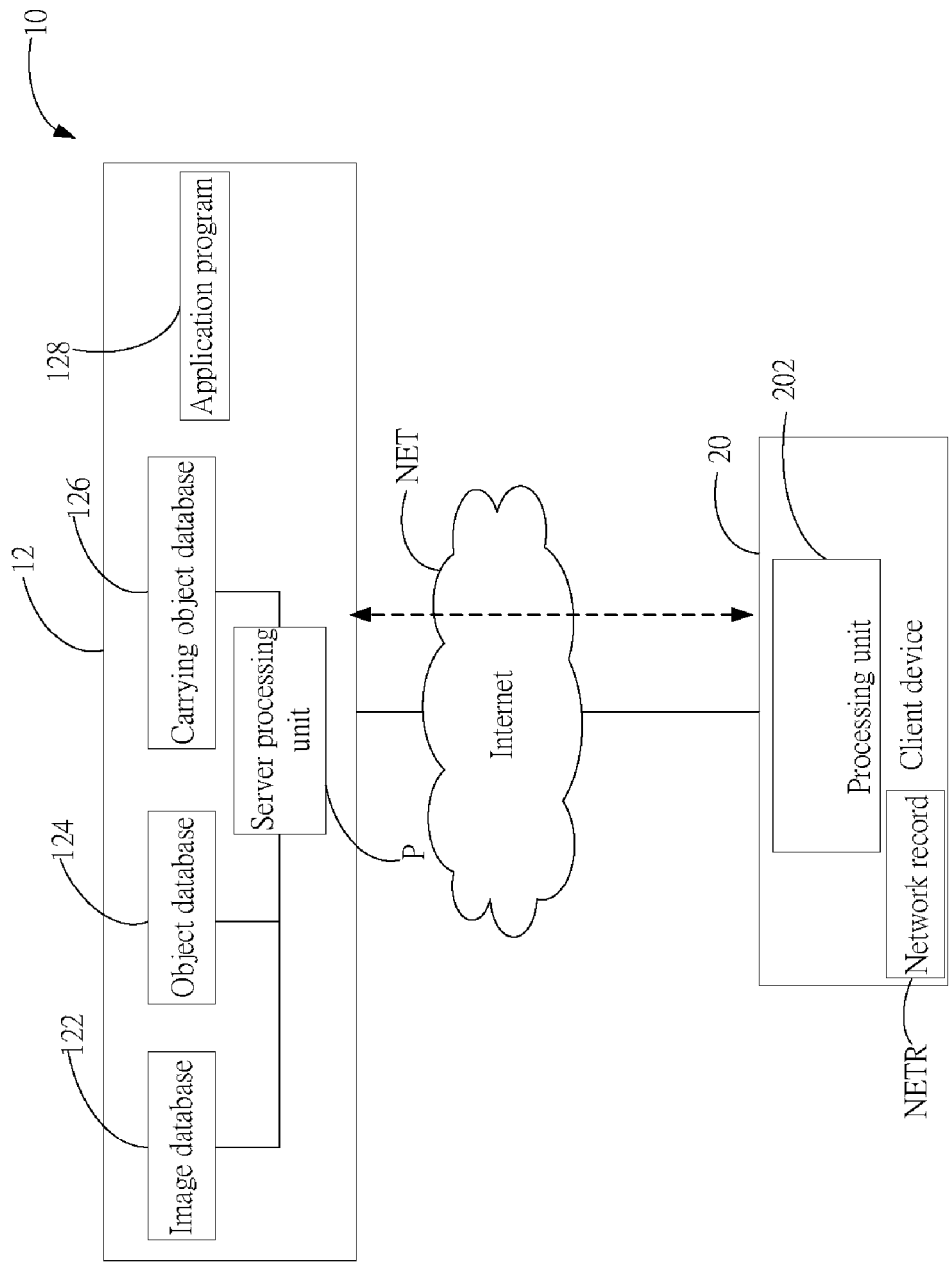
FIG. 2 is a system diagram of the first embodiment of the invention.
Figure 3:
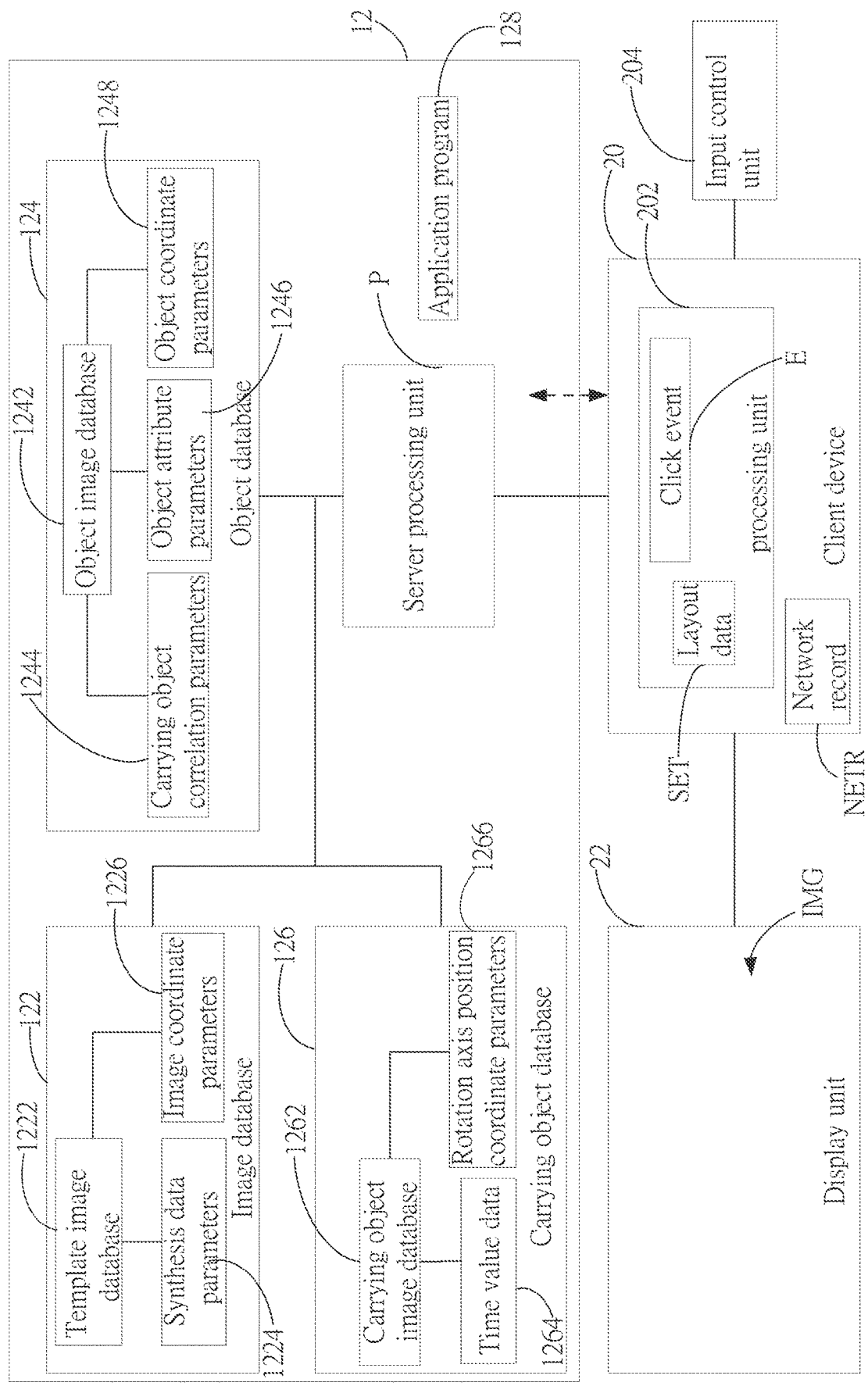
FIG. 3 shows the connections between the databases in the first embodiment of the invention.

Please refer to FIG. 2 and FIG. 3 respectively for the system of the first embodiment of the present invention and the connections between the databases in the first embodiment. As shown in FIG. 2, the method of the invention for displaying simulation images through clicking and rolling operations employs a design system 10 that includes a server 12 and a client device 20. The server 12 is provided with a server processing unit P, an image database 122, an object database 124, and a carrying object database 126, and has an application program 128. Please note that the server 12 in this embodiment is only an example. The client device 20 in this embodiment is connected to the server 12 through the Internet NET in order to execute the application program 128. Alternatively, the client device 20 in the invention may download the application program 128 through the Internet NET to a local terminal in order to execute the application program 128. In either case, the application program 128 is executed in the same way as described below. The client device 20 may also download the image database 122, the object database 124, the carrying object database 126, and the application program 128 to itself after being connected to the server 12, in order to work in a standalone manner; in that case, the application program 128 is executed in the same way as described below, too. The client device 20 is provided with a processing unit 202 (e.g., a central processing unit, or CPU) and an input control unit 204 (e.g., a keyboard, a computer mouse, or a touchscreen) and is connected to a display unit 22 for displaying screen images IMG.

Figure 7A:
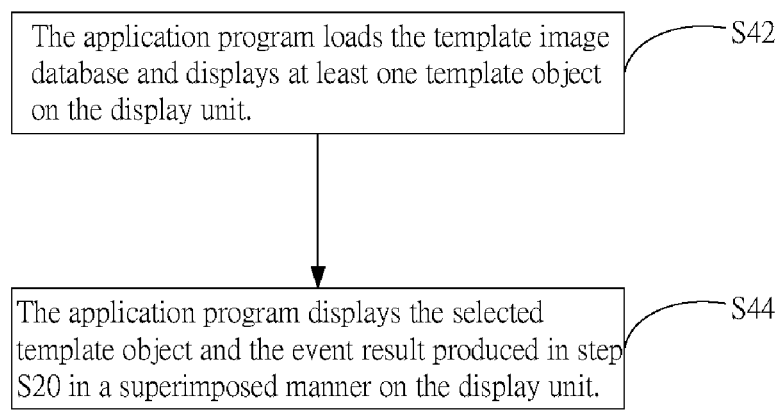
FIG. 7A is the flowchart for loading a template object according to the first embodiment of the invention.
Figure 7B:
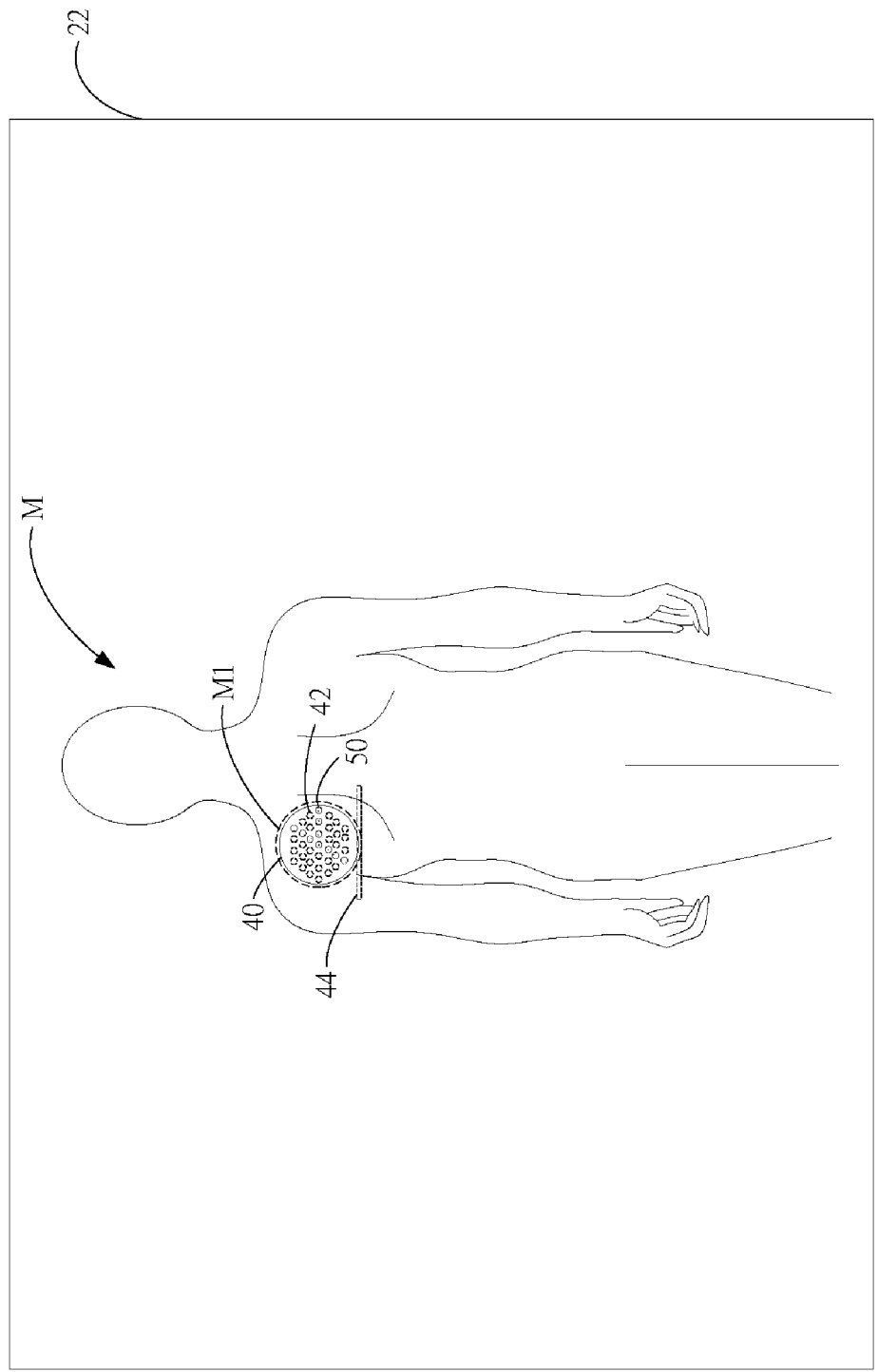
FIG. 7B schematically shows a template object in the first embodiment of the invention.
Figure 8:
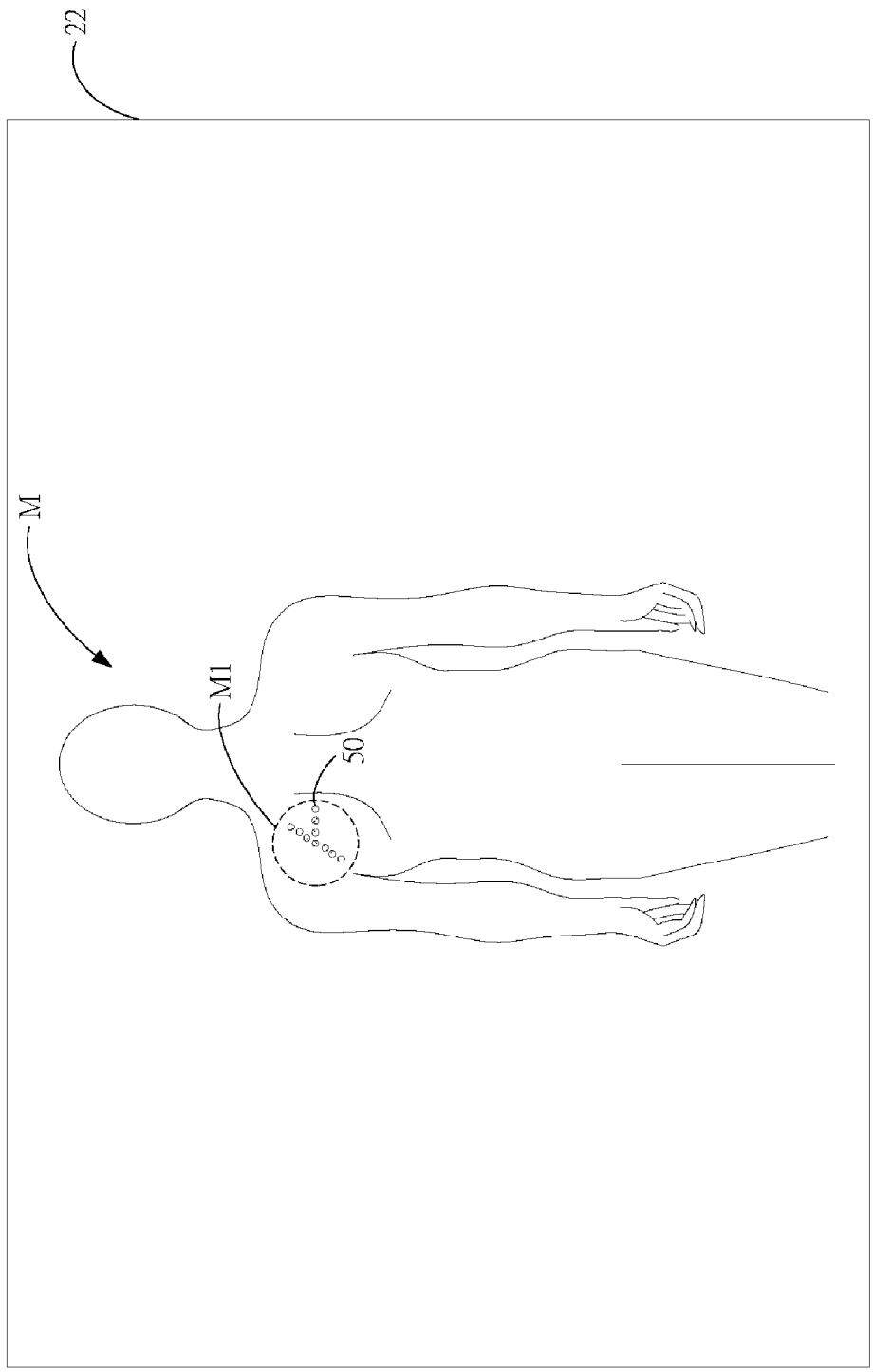
FIG. 8 is similar to FIG. 7B except that the carrying object has been removed.

As shown in FIG. 3, and with reference also to FIG. 4B, FIG. 7B, FIG. 8, FIG. 9A, and FIG. 9B, the image database 122 is provided with a template image database 1222, synthesis data parameters 1224, and image coordinate parameters 1226. The template image database 1222 stores the image data of at least one template object M (as shown in FIG. 7B and FIG. 8). The image coordinate parameters 1226 are the coordinate data of the position of the at least one template object M. The synthesis data parameters 1224 are parameters corresponding to at least one synthesis area M1 (as shown in FIG. 7B) on the at least one template object M. Any template object M and the desired synthesis area M1 thereon (as shown in FIG. 7B) can be selected via the client device 20 and then loaded through the application program 128 from the template image database 1222, the image coordinate parameters 1226, and the synthesis data parameters 1224, in order for the application program 128 to display the image of the selected template object M and synthesis area M1 on the display unit 22. The object database 124 is provided with an object image database 1242, carrying object correlation parameters 1244, object attribute parameters 1246, and object coordinate parameters 1248. The object image database 1242 stores the image data of at least one structural object 50. The carrying object correlation parameters 1244 are correlation parameters corresponding to the connection or separation between each structural object 50 and a corresponding carrying object 40 (as shown in FIG. 5B). The object attribute parameters 1246 correspond to the hidden state and the displayed state of each structural object 50. The object coordinate parameters 1248 are coordinate parameters corresponding to the at least one structural object 50.

The carrying object database 126 is provided with a carrying object image database 1262, time value data 1264, and rotation axis position coordinate parameters 1266. The carrying object image database 1262 stores the image data of at least one carrying object 40. The time value data 1264 includes time parameters corresponding to the display of the rolling of the at least one carrying object 40. The rotation axis position coordinate parameters 1266 correspond to image positions on the display unit 22 that correspond to the at least one carrying object 40 and to a virtual rotation axis 44 connected to the carrying object 40. In this embodiment, each structural object 50 is pre-stored in the object image database 1242 and is the image of a circular jewel by way of example only; each structural object 50 may alternatively be a pearl, crystal, metallic object, or other structural object that serves as a decorative material and can be adhesively bonded to the human body or the surface of an object, wherein the shape, material, and color of each structural object may vary. Besides, the at least one template object M in this embodiment is the contour of the backside of a human body by way of example only; each template object M may alternatively be the image of a computer-related product, a communication-related product, a consumer electronic product, a personal accessory, a daily object, a bicycle frame, or other object whose external decoration is to be designed and simulated. Each template object M may be provided with a plurality of synthesis areas M1 on each of which an image can be superimposed, and which can be selected via the client device 20. In addition, the carrying object database 126 in this embodiment pre-stores a plurality of predetermined positions 42 (such as but not limited to the 37 predetermined positions 42 shown in FIG. 4B) on the at least one carrying object 40. The at least one carrying object 40 and the predetermined positions 42 provided thereon can be adjusted as needed. For example, each carrying object 40 may have a rectangular or other shape and be sized as desired, and the number of the predetermined positions 42 may be greater than or less than 37. The size or appearance of each predetermined position 42 may also be reduced so that the predetermined positions 42 can be more densely arranged.

Figure 4A:
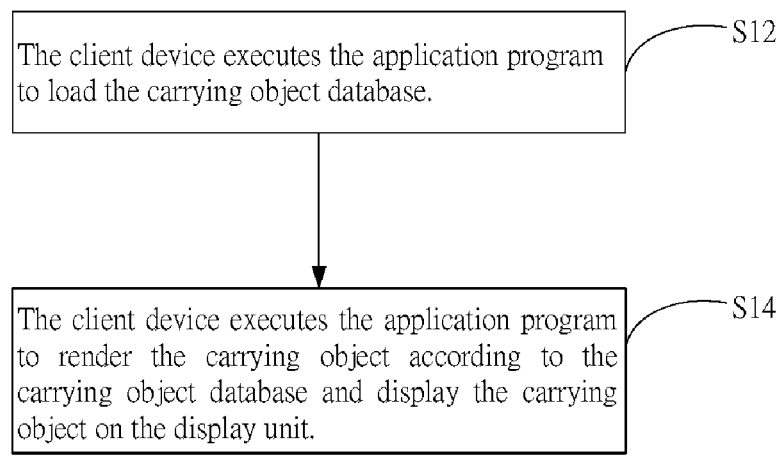
FIG. 4A is the flowchart for displaying a carrying object according to the first embodiment of the invention.
Figure 4B:
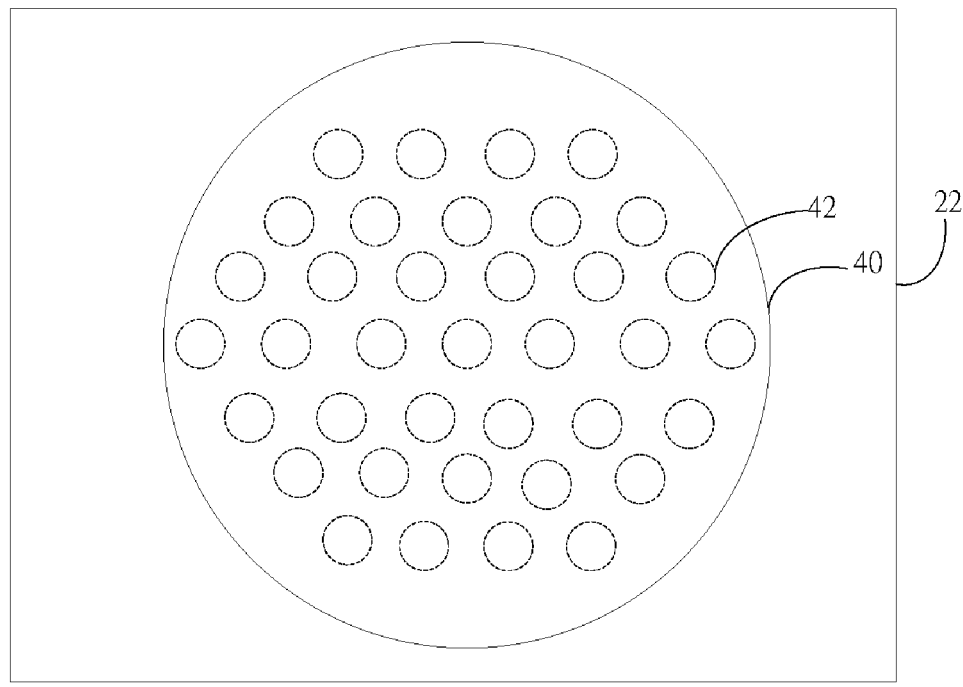
FIG. 4B schematically shows a carrying object in the first embodiment of the invention.

Referring to FIG. 4A and FIG. 4B in conjunction with FIG. 2 and FIG. 3, step S10 of the client device executing the application program to display the carrying object includes the following sub-steps:

Sub-step S12: The client device executes the application program to load the carrying object database.

Sub-step S14: The client device executes the application program to render the carrying object according to the carrying object database and display the carrying object on the display unit.

In sub-step S12, the client device 20 is connected to the server 12 through the Internet NET to execute the application program 128. The client device 20 is connected to the image database 122, the object database 124, and the carrying object database 126 through the server processing unit P of the server 12 and loads the carrying object database 126. In sub-step S14 that follows, the client device 20 executes the application program 128 to render the carrying object 40 according to the related rendering parameters in the carrying object image database 1262 in the carrying object database 126 and display the carrying object 40 on a screen image IMG of the display unit 22.

Figure 5A:
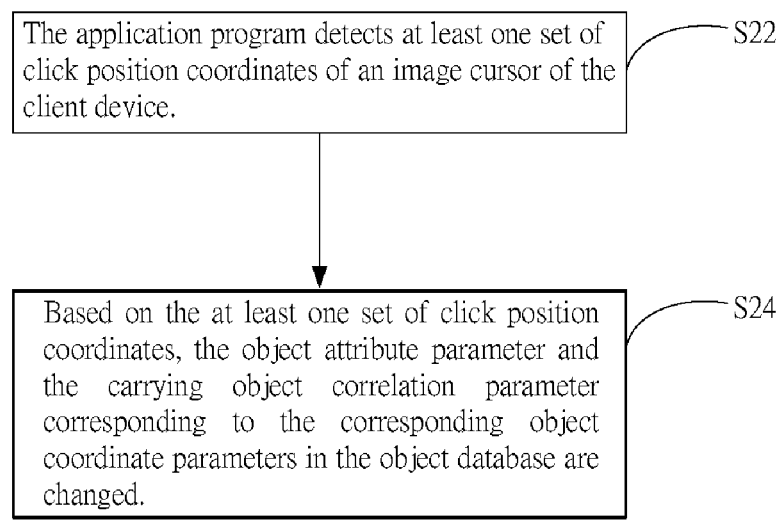
FIG. 5A is the flowchart for generating a click event according to the first embodiment of the invention.
Figure 5B:
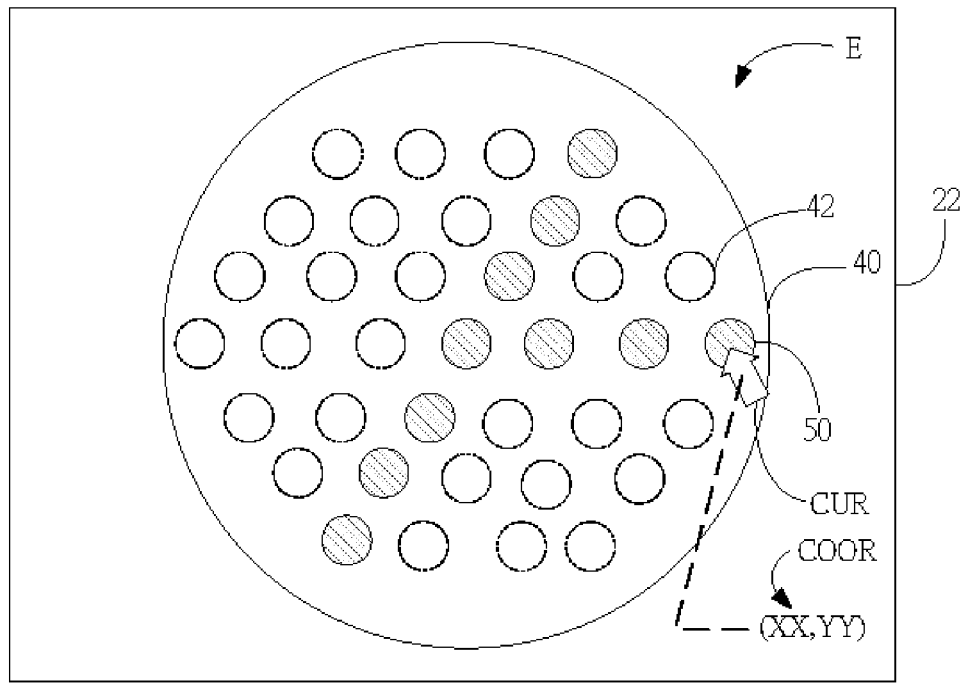
FIG. 5B schematically shows a click event in the first embodiment of the invention.

In step S20, referring to FIG. 5A and FIG. 5B in conjunction with FIG. 1 to FIG. 3, the processing unit 202 generates a click event E according to the application program 128, and the generation of the click event E includes the following sub-steps:

Sub-step S22: The application program detects at least one set of click position coordinates of an image cursor of the client device.

Sub-step S24: Based on the at least one set of click position coordinates, the object attribute parameter and the carrying object correlation parameter corresponding to the corresponding coordinate parameters in the object database are changed.

In sub-step S22, the client device 20 controls an image cursor CUR through the input control unit 204 in order to click at at least one predetermined position 42 on the carrying object 40 with the image cursor CUR. As each predetermined position 42 corresponds to a set of click position coordinates COOR, the application program 128 detects the click position coordinates COOR of the image cursor CUR according to the predetermined positions 42 while being executed. In sub-step S24, the application program 128 changes the object attribute parameter 1246 of the structural object 50 corresponding to the at least one predetermined position 42 clicked with the image cursor CUR according to the corresponding object coordinate parameters 1248, thereby switching the structural object 50 corresponding to the at least one set of click position coordinates COOR to the hidden state or the displayed state. In this embodiment, and by way of example only, the default setting is to have a hidden-state structural object 50 assigned to each predetermined position 42 on the carrying object 40. It should be pointed out that the display unit 22 will not display any hidden-state structural object 50 on a screen image IMG.

The click event E involves the user operating the image cursor CUR with the input control unit 204 and clicking at a predetermined position 42 corresponding to the position of the image cursor CUR (as shown in FIG. 5B) such that the object attribute parameter 1246 and the carrying object correlation parameter 1244 of the structural object 50 corresponding to the clicked predetermined position 42 are changed in response to the user's click, and that in consequence the image layer where the structural object 50 is in is changed, i.e., placed under or over the image layer where the carrying object 40 is in, in order for the display unit 22 to display the structural object 50 as in the hidden state or the displayed state, and for the structural object 50 to be connected to or separated from the carrying object 40. When the structural object 50 is in the hidden state, the carrying object correlation parameter 1244 of the structural object 50 is "being connected to the carrying object 40", and when the structural object 50 is in the displayed state, the carrying object correlation parameter 1244 of the structural object 50 is "being separated from the carrying object 40".

The image layer where the structural object 50 is in may also be switched via a shielding object in order to switch the structural object 50 to the hidden state or the displayed state. More specifically, by clicking at the predetermined position 42 to which the structural object 50 corresponds, the structural object 50 may be shielded by the shielding object (not shown) corresponding to the resulting click position coordinates COOR and thus switched to the hidden state, or the corresponding shielding object may be made disappear to switch the structural object 50 to the displayed state. Thus, by changing the image layer where the structural object 50 is in, the corresponding shielding object switches the structural object 50 to the hidden state or the displayed state. In this embodiment, the generation of a click event entails controlling the image cursor CUR in order to click at a predetermined position 42 on the carrying object 40 with the image cursor CUR, but the clicking operation does not necessarily involve the image cursor CUR and may include, among other feasible clicking operations, the user directly touching a touchscreen, with the touch position corresponding to a predetermined position 42 on the carrying object 40.

Figure 6:
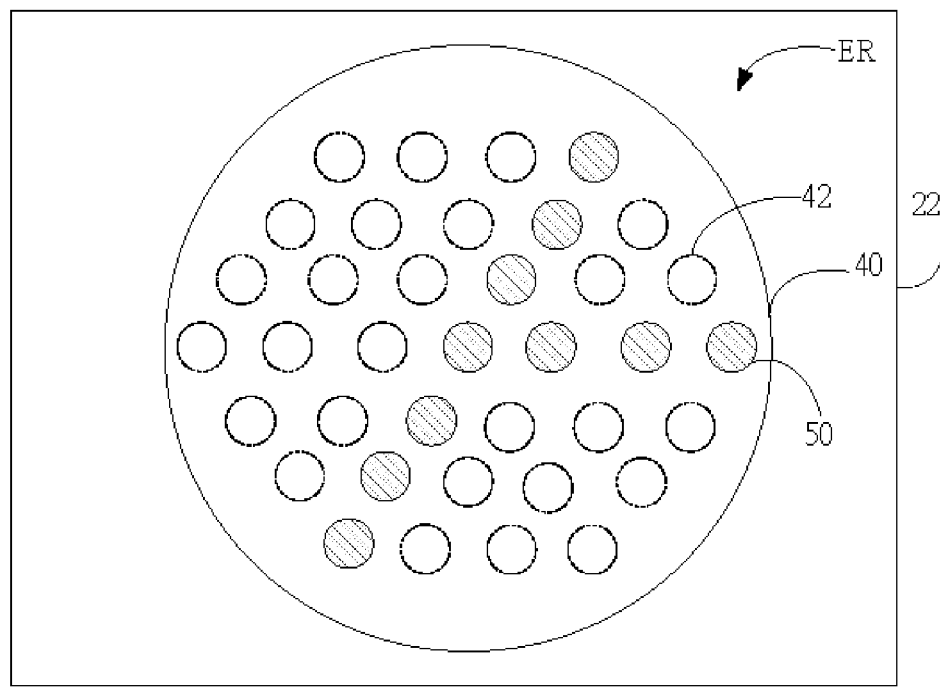
FIG. 6 schematically shows how a carrying object carries a plurality of structural objects according to the first embodiment of the invention.

In addition, prior to the generation of the click event E, i.e., prior to step S20, the application program 128 may refer to a network record NETR corresponding to the client device 20 (e.g., a record of the last execution of the application program 128 by the client device 20) and display the corresponding structural object(s) 50 and carrying object 40 on the display unit 22. Furthermore, while displaying the corresponding structural object(s) 50 and carrying object 40 on the display unit 22 prior to the generation of the click event E, the display unit 22 may also display the materials and/or shapes of the structural object(s) 50 on the display unit 22 so that the user of the client device 20 can select, via the input control unit 204, the material (s) and/or shape (s) of the structural object(s) 50 and/or carrying object 40 to be used in the user's design. Then, in step S20, the click event E is generated by the user clicking with the image cursor CUR so as to display at least one structural object 50 as superimposed on the carrying object 40. Thus, referring to FIG. 6 in conjunction with FIG. 2 and FIG. 3, the user can execute the application program 128 and use the input control unit 204 to instruct the processing unit 202 to generate the click event E while designing the desired arrangement of the at least one structural object 50, in order to produce an event result ER, such as the arrangement of the displayed-state structural objects 50 shown in FIG. 6, wherein the arrangement may be in the shape of an animal or flower, a line-based pattern, or other geometric patterns. In this embodiment, the at least one structural object 50 is arranged in a line-based pattern by way of example.

In step S30, the processing unit 202 determines by way of the application program 128 if the click event E has ended, i.e., if the design of the at least one structural object 50 is completed. If the determination result is no, step S20 will be performed again, allowing the user to continue generating the click event E. If the determination result is yes, the process flow will proceed with step S40.

Referring to FIG. 7A and FIG. 7B in conjunction with FIG. 2 and FIG. 3, step S40 includes the following sub-steps:

Sub-step S42: The application program loads the image database and displays the at least one template object on the display unit.

Sub-step S44: The application program displays a selected one of the at least one template object and the event result produced in step S20 on the display unit in a superimposed manner.

In sub-step S42, the application program 128 reads the image database 122 and displays on the display unit 22 the at least one template object M stored in the template image database 1222 so that the user can select from the at least one template object M displayed. In sub-step S44 that follows, the user of the client device 20 selects one of the at least one template object M and the desired synthesis area M1 on the template object M through the application program 128. In this embodiment, the selected template object M is the contour of the backside of a human body by way of example. The application program 128 then places the at least one structural object 50 (whose arrangement has been completed in step S20) and the carrying object 40 on the selected synthesis area M1 of the selected template object M according to the corresponding template image data, image coordinate parameters, and synthesis data parameters in the image database 122, in order for the display unit 22 to display the carrying object 40 and the at least one structural object 50 as superimposed on the synthesis area M1, wherein the selected template object M corresponds to an object to which the at least one structural object 50 will be applied for simulated presentation.

Figure 9A:
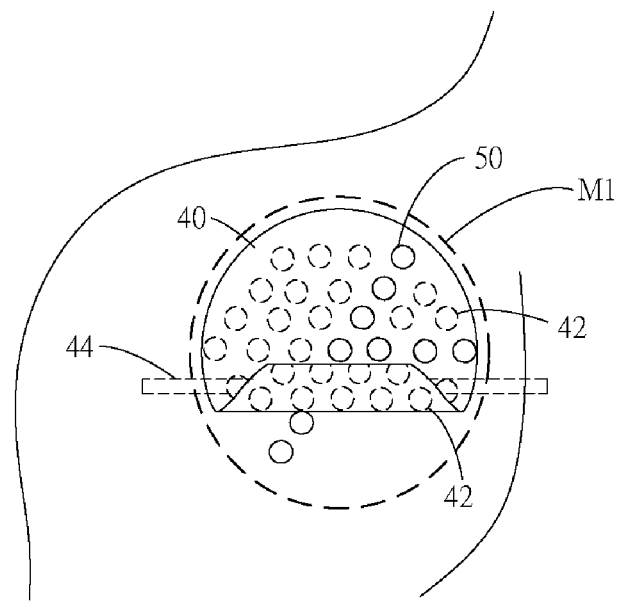
FIG. 9A schematically shows a carrying object starting to be rolled according to the first embodiment of the invention.
Figure 9B:
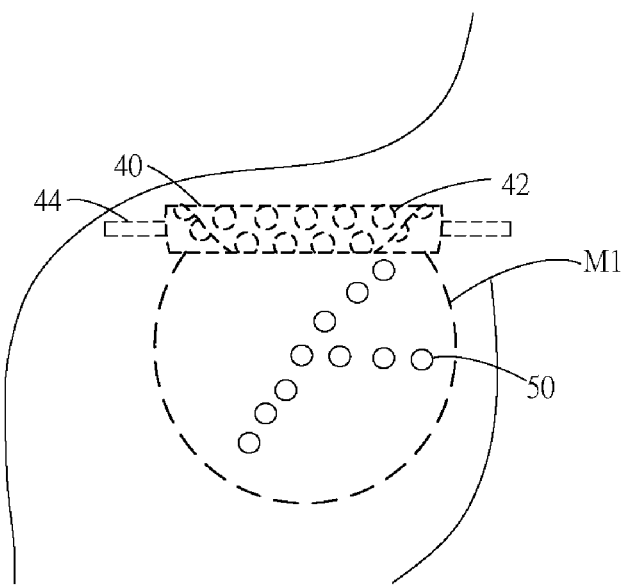
FIG. 9B schematically shows the carrying object in FIG. 9A rolled until disappearing.

In step S50, referring to FIG. 7B and FIG. 8 in conjunction with FIG. 2 and FIG. 3, the input control unit 204 of the client device 20 is used to instruct the application program 128 to generate a rolling event of the carrying object 40, in which the client device 20 rolls the carrying object 40 on the screen image IMG of the display unit 22 until the carrying object 40 disappears. More specifically, referring to FIG. 9A and FIG. 9B, the carrying object 40 is rolled as controlled by a virtual rotation axis 44 connected to the carrying object 40 and eventually disappears. To carry out this operation, the application program 128 detects the image position on the display unit 22 that corresponds to the rotation axis position coordinate parameter 1266, wherein the image position is in the synthesis area M1, such as the position of the carrying object 40 and the virtual rotation axis 44 as shown in FIG. 7B. The application program 128 also detects the time value data 1264 corresponding to the virtual rotation axis 44 being moved via the input control unit 204 of the client device 20. Then, the application program 128 displays a dynamic image of the carrying object 40 (e.g., the image shown in FIG. 9A, which shows the carrying object 40 being rolled) according to the time value data 1264, with the carrying object 40 being rolled over and over on the virtual rotation axis 44, and the dynamic image corresponding to the time value data 1264. During the process, the application program 128 renders the degree of rolling of the carrying object 40 and displays the degree of rolling on the display unit 22 according to the time value data 1264. Once completely rolled around the virtual rotation axis 44, the carrying object 40 disappears together with the virtual rotation axis 44 (as shown in FIG. 9B). The present invention, however, is not limited to rolling the carrying object 40 over and over on the virtual rotation axis 42 until the carrying object 40 disappears; the carrying object 40 may instead be peeled off, or directly made transparent, once completely rolled around the virtual rotation axis 44, so as to disappear from the screen image IMG of the display unit 22.

Continued from the above, any structural object 50 that is in the hidden state will be rolled along with the carrying object 40 until disappearing from the screen image IMG. More specifically, the carrying object correlation parameter 1244 of a hidden-state structural object 50 is "being connected to the carrying object 40", so the coordinate parameters corresponding to the structural object 50 will change according to the time value data 1264, meaning the structural object 50 will be rolled along with the carrying object 40 until disappearing from the display unit 22. By contrast, the carrying object correlation parameter 1244 of a displayed-state structural object 50 is "being separated from the carrying object 40", so the structural object 50 will be displayed on the synthesis area M1 of the template object M, such as the displayed-state structural objects 50 shown in FIG. 8. In addition, the client device 20 will temporarily store the image(s) of the displayed-state structural object(s) 50 and the template object M selected for use therewith into layout data SET through the processing unit 202.

The present invention further provides a shielding method as explained below. The second embodiment of the disclosed method for displaying simulation images through clicking and rolling operations also includes the foregoing step S10 to step S50 except that, referring to FIG. 9C, the carrying object 40 has a first-layer object 46 and a second-layer object 48, wherein the first-layer object 46 and the second-layer object 48 can be viewed as located in different image layers respectively, with one superimposed on the other. In step S20 and step S50, the hidden-state structural objects 50 are shielded by the image layer where the corresponding shielding objects are in and therefore are not displayed on the display unit 22. The carrying object correlation parameters 1244 of the hidden-state structural objects 50 are "being connected to the second-layer object 48 of the carrying object 40".

Figure 9C:
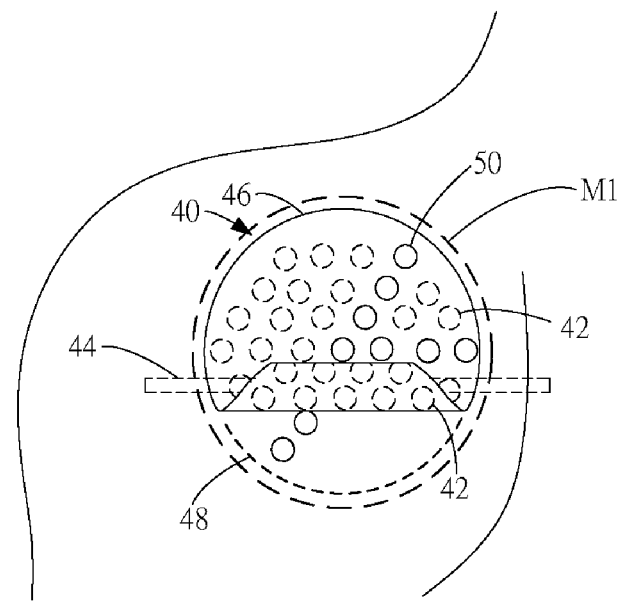
FIG. 9C schematically shows a carrying object starting to be rolled according to the second embodiment of the invention.
Figure 9D:
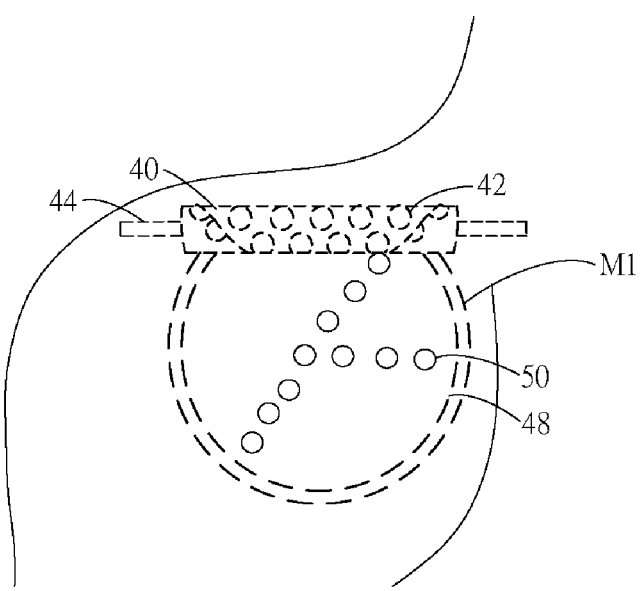
FIG. 9D schematically shows the carrying object in FIG. 9C rolled until disappearing.

On the other hand, all those structural objects 50 that are not shielded by the image layer where the corresponding shielding objects are in are displayed on the display unit 22, and the carrying object correlation parameters 1244 of those structural objects 50 are "being separated from the first-layer object 46 and the second-layer object 48 of the carrying object 40". In step S50, the application program 128 generates the rolling event of the carrying object 40 and displays on the display unit 22 a dynamic image showing the first-layer object 46 of the carrying object 40 being rolled (as shown in FIG. 9C). In the meantime, the second-layer object 48 of the carrying object 40 (which is on the synthesis area M1) and the structural objects 50 connected thereto are shielded by the image layer where the corresponding shielding objects are in and therefore disappear. As the virtual rotation axis 44 continues being moved, the first-layer object 46 of the carrying object 40 keeps rolling according to the time value data 1464 and eventually disappears (as shown in FIG. 9D). In consequence, only those structural objects 50 that are not shielded by the corresponding shielding objects and are separated from the first-layer object 46 and the second-layer object 48 of the carrying object 40 (e.g., the structural objects 50 shown in FIG. 8) are displayed on the synthesis area M1 of the template object M. In this embodiment, the object coordinate parameters 1248 corresponding to those structural objects 50 that are shielded by the corresponding shielding objects along with the second-layer object 48 of the carrying object 40 and are connected to the second-layer object 48 of the carrying object 40 do not change according to the time value data 1264. The remaining actions of step S10 to S50 are the same as in the previous embodiment.

Figure 10:
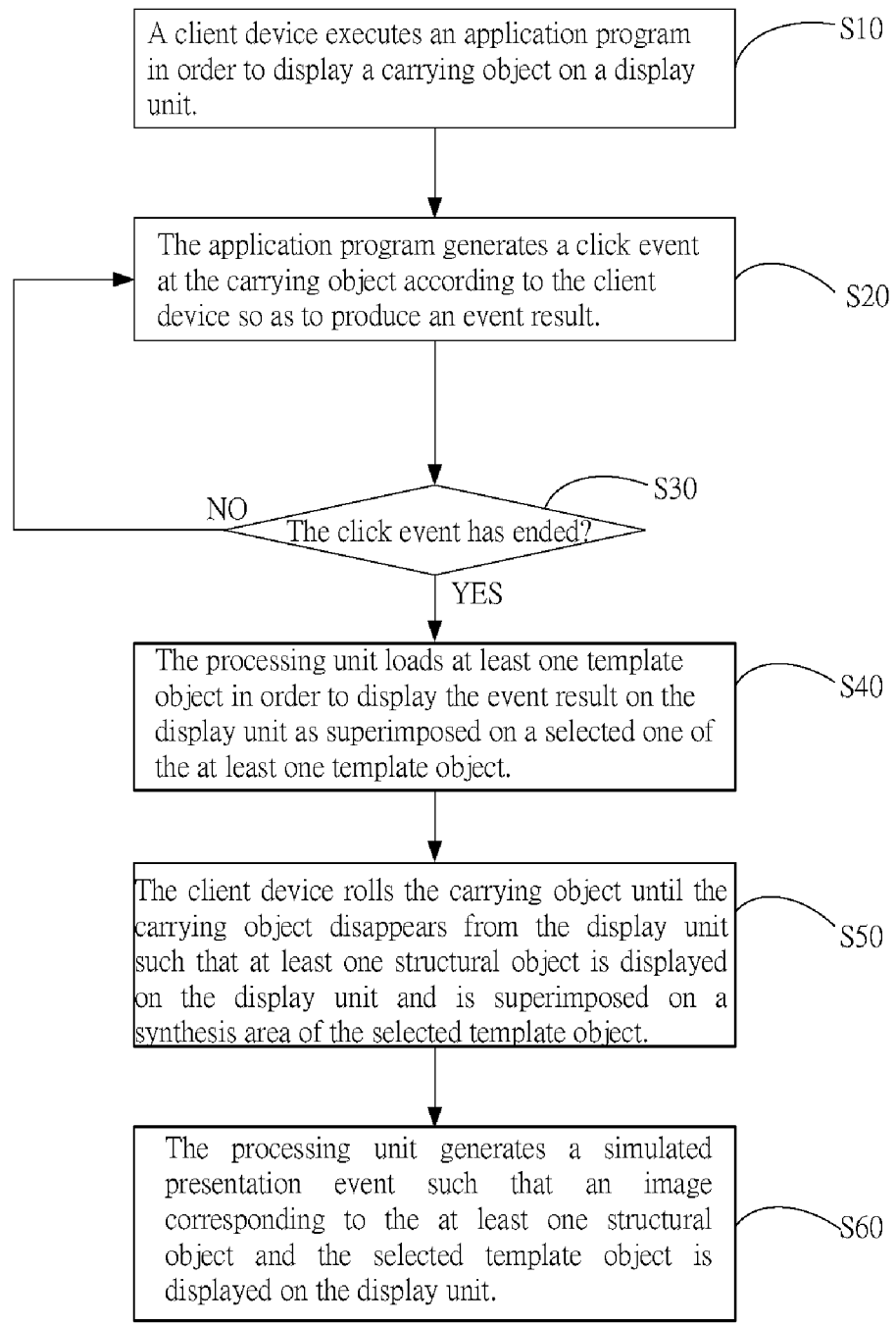
FIG. 10 is the flowchart of the third embodiment of the invention.

Please refer to FIG. 10 for the flowchart of the third embodiment of the present invention. Referring also to FIG. 3, the method of the invention for displaying simulation images through clicking and rolling operations may further provide a simulated presentation such that the steps of the method are as follows:

Step S10: A client device executes an application program in order to display a carrying object on a display unit.

Step S20: The application program generates a click event at the carrying object according to the client device so as to produce an event result.

Step S30: It is determined if the click event has ended.

Step S40: At least one template object is loaded in order to display the event result and a selected one of the at least one template object on the display unit in a superimposed manner.

Step S50: The client device rolls the carrying object until the carrying object disappears from the display unit, leaving at least one structural object displayed on the display unit and superimposed on a synthesis area of the selected template object.

Step S60: A processing unit generates a simulated presentation event to display an image corresponding to the at least one structural object and the selected template object on the display unit.

The actions performed in step S10 through step S50 may be those in either of the two embodiments disclosed above and therefore will not be described repeatedly. In step S60 that follows, the display unit 22 displays an image as shown in FIG. 8, i.e., an image of the selected template object M and the at least one structural object 50 superimposed thereon. More specifically, the client device 20 produces, through the processing unit 202, a static or dynamic image equivalent to the image shown in FIG. 8 in order for the display unit 22 to display the image as a screen image IMG. The client device 20 may perform step S60 directly according to the execution result of step S50, or the client device 20 may read the layout data SET before performing step S60. Once step S60 is completed, the client device 20 re-reads and displays the event result ER produced in step S20, i.e., the layout of the at least one structural object 50 with respect to the carrying object 40, and may further store the event result ER as document data, image data, or vector data.

In the foregoing embodiments, the client device 20 may, either before, during, or after step S20, instruct the application program 128 to refer to the network record NETR corresponding to the client device 20 and display the corresponding structural object(s) 50 and carrying object 40 so that the user of the client device 20 can select the material (s) and/or shape (s) of the structural object(s) 50 and/or the carrying object 40 through the input control unit 204.

The foregoing embodiments are summarized below in terms of practical design stages.

The design stage: Referring to FIG. 2, FIG. 3, FIG. 4A, and FIG. 4B, the client device 20 executes the application program 128 to render the carrying object 40 according to the carrying object database 126 and display the carrying object 40 on the display unit 22. The carrying object 40 has the plural predetermined positions 42, which are the predetermined positions of structural objects 50, and where structural objects 50 preset to the hidden state are respectively disposed. After that, referring to FIG. 5A and FIG. 5B, the image cursor CUR is used to click at at least one of the predetermined positions 42 during the generation of the click event E, thereby generating at least one set of click position coordinates COOR. Then, based on the object coordinate parameters 1248 of the structural objects 50, the object attribute parameters 1246 of the structural objects 50 are switched in order to switch the structural objects 50 between the hidden state and the displayed state and display the switching process on the display unit 22 with animation. The carrying object correlation parameter 1244 of each structural object 50 in the hidden state is set as "being connected to the carrying object 40", and the carrying object correlation parameter 1244 of each structural object 50 in the displayed state is set as "being separated from the carrying object 40".

The preceding paragraph describes a digital experience of designing the structural objects.

The present invention can further simulate the design result of the digital experience so as to enhance, or more particularly add a sense of presence to, the digital experience as follows.

The template selection stage: Referring to FIG. 2, FIG. 3, FIG. 7A, and FIG. 7B, after detecting the end of the click event E by executing the application program 128, the processing unit 202 of the client device 20 loads at least one template object M through the server processing unit P in order for the user of the client device 20 to select a template object M from the at least one template object M. Following that, the carrying object 40 and the displayed-state structural object(s) 50 are displayed as superimposed on the synthesis area M1 of the selected template object M, wherein the states of the structural objects 50 on the carrying object 40 include the displayed state and the hidden state.

The simulation stage: Referring to FIG. 8 and FIG. 9A-9B or FIG. 9C-9D, the input control unit 204 of the client device 20 is used to instruct the application program 128 to generate the rolling event of the carrying object 40. The application program 128, therefore, rolls the carrying object 40 and any structural object 50 whose carrying object correlation parameter 1244 is "being connected to the carrying object 40" (i.e., which is in the hidden state) according to the time value data 1264 until the carrying object 40 and the hidden-state structural object(s) 50 disappear, leaving the screen image IMG of the display unit 22 with the displayed-state structural object(s) 50, which is/are superimposed on the synthesis area M1 of the selected template object M. Then, the input control unit 204 of the client device 20 can be used to instruct the application program 128 to perform a simulated presentation, i.e., to display on the display unit 22 a static or dynamic image corresponding to the image shown in FIG. 8, e.g., to show the image of FIG. 8 either as a dynamic image in which a model walls on a T-shaped catwalk as in a fashion show, or as a static three-dimensional image, thereby providing an enhanced digital experience that features a sense of presence.

The method of the present invention for displaying simulation images through clicking and rolling operations can be applied to the external design of various products and to image processing where the images of objects need to be superimposed on one another. The method provides a digital experience that facilitates design and simulation and allows the user to immediately view a concrete image, and thereby check the visual effect, of the design result.

The embodiments described above are only some preferred ones of the present invention and are not intended to be restrictive of the scope of the invention. Any equivalent changes and modifications made according to the technical concept, features, and spirit stated in the appended claims shall fall within the scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for displaying simulation images through clicking and rolling operations, comprising steps of:
   executing an application program by a client device in order to display a carrying object on a display unit;
   generating a click event at the carrying object by the application program according to the client device so as to produce an event result, wherein the click event provides at least one set of click position coordinates corresponding to displaying at least one structural object on the carrying object, and the event result is the at least one structural object being displayed as superimposed on the carrying object;
   loading at least one template object when the click event ends, in order to display the event result on the display unit as superimposed on a selected one of the at least one template object; and
   rolling the carrying object by the client device until the carrying object disappears from the display unit such that the at least one structural object is displayed on the display unit as superimposed on a synthesis area of the selected template object;
   wherein the step of rolling the carrying object by the client device until the carrying object disappears from the display unit includes: detecting, by the application program, an image position on the display unit that corresponds to a rotation axis parameter of the carrying object and of a virtual rotation axis connected to the carrying object and displaying a dynamic image of the carrying object on the display unit by the application program according to time value data corresponding to the virtual rotation axis being moved by the client device, wherein the dynamic image of the carrying object corresponds to the time value data, and the application program renders, and displays on the display unit, a degree of rolling of the carrying object according to the time value data.

2. The method for displaying the simulation images through the clicking and rolling operations as claimed in claim 1, further comprising a step of:
generating a simulated presentation event by the client device such that a dynamic or static image corresponding to the at least one structural object and the selected template object is displayed on the display unit.

3. The method for displaying the simulation images through the clicking and rolling operations as claimed in claim 1, wherein the step of generating the click event at the carrying object by the application program according to the client device includes displaying at least one said structural object and said carrying object on the display unit by the application program according to at least one network record of the client device.

4. The method for displaying the simulation images through the clicking and rolling operations as claimed in claim 1, wherein the at least one structural object has a carrying object correlation parameter set as "being separated from the carrying object" and is displayed on the synthesis area of the selected template object, whereas any other said structural object has a carrying object correlation parameter set as "being connected to the carrying object" and is therefore rolled along with the carrying object according to the time value data until disappearing from the display unit.

5. The method for displaying the simulation images through the clicking and rolling operations as claimed in claim 1, wherein the carrying object comprises a first-layer object and a second-layer object, the at least one structural object has a carrying object correlation parameter set as "being separated from the first-layer object and the second-layer object of the carrying object" such that an image of the at least one structural object is displayed on the synthesis area of the selected template object, any other said structural object has a carrying object correlation parameter set as "being connected to the second-layer object of the carrying object" such that a shielding object makes not only the second-layer object of the carrying object but also the any other said structural object connected to the second-layer object of the carrying object disappear from the display unit, and the first-layer object of the carrying object is rolled according to the time value data until disappearing.

6. The method for displaying the simulation images through the clicking and rolling operations as claimed in claim 1, wherein the step of executing the application program by the client device in order to display the carrying object on the display unit includes: reading a carrying object database by the application program through a server processing unit of a server in order to render the carrying object and display the carrying object on the display unit.

7. The method for displaying the simulation images through the clicking and rolling operations as claimed in claim 1, wherein the step of generating the click event at the carrying object by the application program according to the client device includes: reading an object database by the application program through a server processing unit of a server; and displaying or hiding at least one said structural object corresponding to the at least one set of click position coordinates on the display unit.

8. The method for displaying the simulation images through the clicking and rolling operations as claimed in claim 1, wherein the step of generating the click event at the carrying object by the application program according to the client device includes: displaying or hiding with animation, by the application program according to the at least one set of click position coordinates, at least one corresponding said structural object, or using a shielding object to switch the at least one corresponding said structural object to being displayed or hidden on the display unit, wherein any said structural object displayed on the display is separated from the carrying object, and any said structural object hidden on the display unit is connected to the carrying object.

* * * * *